(12) United States Patent
Hagino

(10) Patent No.: US 7,663,406 B2
(45) Date of Patent: Feb. 16, 2010

(54) OUTPUT CIRCUIT

(75) Inventor: Koichi Hagino, Kawanishi (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 12/202,780

(22) Filed: Sep. 2, 2008

(65) Prior Publication Data

US 2009/0072864 A1   Mar. 19, 2009

(30) Foreign Application Priority Data

Sep. 13, 2007   (JP) .............................. 2007-238274

(51) Int. Cl.
*H03K 19/0948* (2006.01)
*H03K 19/017* (2006.01)

(52) U.S. Cl. .............................. 326/83; 326/17; 326/27; 327/205

(58) Field of Classification Search ................... 326/83, 326/86, 17, 27, 121; 327/374, 205
See application file for complete search history.

(56) References Cited

U.S. PATENT DOCUMENTS 4,953,070 A   8/1990   Lenz 5,698,994 A *   12/1997   Tsuji ............................ 326/83

FOREIGN PATENT DOCUMENTS

| JP | 4-371021 | 12/1992 |
|---|---|---|
| JP | 2000-49586 | 2/2000 |
| JP | 2002-297248 | 10/2002 |

* cited by examiner

*Primary Examiner*—Daniel D Chang
(74) *Attorney, Agent, or Firm*—Cooper & Dunham, LLP

(57) ABSTRACT

An output circuit including an input terminal; an output terminal; a PMOS transistor connected with a positive side of a power voltage and the output terminal; a NMOS transistor connected with a negative side of the power supply voltage and the output terminal; a first inverter, to which a gate voltage of the PMOS transistor is input and which exhibits hysteresis in threshold voltage; and a second inverter, to which a gate voltage of the NMOS transistor is input and which exhibits hysteresis in threshold voltage, wherein an OR logic signal of the input signal and a signal obtained by inverting an output signal from the second inverter is input to a gate of the PMOS transistor, and an AND logic signal of the input signal and a signal obtained by inverting an output signal from the first inverter is input to a gate of the NMOS transistor.

3 Claims, 4 Drawing Sheets

US 7,663,406 B2

OUTPUT CIRCUIT

BACKGROUND OF THE INVENTION

1. Field of the Invention

The present invention relates to an output circuit. More particularly, the present invention relates to an output circuit having a CMOS configuration.

2. Discussion of the Related Art

Conventional output circuits having a CMOS configuration, which have been used for synchronous rectification type step-down DC-DC converters, have the following drawback. Specifically, when a control signal is input to gates of a PMOS transistor and a NMOS transistor, which gates are connected with each other, and the control signal changes from a low level to a high level or vice versa, there is a period in which both the PMOS transistor and NMOS transistor are in an ON state at the same time, resulting in flow of a large current therethrough (hereinafter referred to as a through current or a through current problem). Thereby, problems in that the consumption current seriously increases and a large noise is produced in the power source are caused.

In attempting to prevent occurrence of the through current problem, such an output circuit as illustrated in FIG. 1 is used. FIG. 2 is a timing chart illustrating the waveforms of voltage at several portions of the circuit illustrated in FIG. 1.

Referring to FIG. 2, a character IN denotes a level (i.e., a high level H or a low level L) of the input terminal of the circuit; a character PH denotes the gate voltage of a PMOS transistor M101; a character A denotes an input signal input to a second input terminal of a NAND circuit 114; a character B denotes an input signal input to a second input terminal of an NOR circuit 111; a character NL denotes a gate voltage of a NMOS transistor M102; a character M101 denotes an ON or OFF state of the PMOS transistor M101; a character M102 denotes an ON or OFF state of the NMOS transistor M102; and a character OUT denotes a level (i.e., a high level H or a low level L) of the output terminal OUT of the output circuit.

When the input terminal IN is on a low level L, the output signal of the NAND circuit 114 is on a high level. Therefore, the output signal output from an inverter 115 is on a low level and the gate voltage NL of the NMOS transistor M102 is on a low level. Therefore, the NMOS transistor M102 is in an OFF state. In addition, since the gate voltage NL of the NMOS transistor M102 is on the low level, the input signal B input to the second input terminal of the NOR circuit 111 attains a low level, and the output signal output from the NOR circuit 111 attains a high level. Further, since the output signal output from an inverter 112 is on a low level, the gate voltage PH of the PMOS transistor M101 is on a low level. Therefore, the PMOS transistor M101 is in an ON state. Furthermore, since the gate voltage PH of the PMOS transistor M101 is input to the second input terminal of the NAND circuit 114 via a buffer circuit 113, the input signal A input to the second input terminal of the NAND circuit 114 is on a low level.

When the input terminal IN attains a high level H, the output signal from the NOR circuit 111 attains a low level, and the output signal from the inverter 112 attains a high level. In this regard, a gate capacitance of the PMOS transistor 101 is charged, and thereby it takes a certain time until the gate voltage PH of the PMOS transistor M101 attains a high level as illustrated in FIG. 2. When the gate voltage PH of the PMOS transistor M101 reaches a half voltage (i.e., Vdd/2) of a power supply voltage Vdd, the output signal A from the buffer circuit 113 inverts and attains a high level. In this regard, a capacitor C101 is charged, and thereby the output signal A from the buffer circuit 113 gradually increases as illustrated in FIG. 2.

When the gate voltage PH of the PMOS transistor M101 increases and exceeds a threshold voltage Vtp, the PMOS transistor M101 achieves an OFF state. At this time, the input signal A has not yet reached the half voltage Vdd/2, and the gate voltage NL of the NMOS transistor M102 is still on the low level. Therefore, the NMOS transistor M102 maintains the OFF state. Accordingly, production of a through current can be prevented.

When the voltage of the output signal from the buffer circuit 113 further increases and reaches the half voltage Vdd/2, the output signal from the NAND circuit 114 attains a low level and thereby the output signal from the inverter 115 attains a high level. In this regard, the gate capacitance of the NMOS transistor M102 is charged, and thereby the gate voltage NL of the NMOS transistor M102 gradually increases as illustrated in FIG. 2. When the gate voltage NL of the NMOS transistor M102 reaches a threshold voltage Vtn, the NMOS transistor M102 achieves an ON state. When the gate voltage NL further increases and reaches the half voltage Vdd/2, the output signal from the buffer circuit 116 attains a high level. In this regard, a capacitor C102 is charged, and therefore it takes a certain time until the input signal B attains a high level as illustrated in FIG. 2. Even when the input signal B input to the second input terminal of the NOR circuit 111 attains a high level, the output signal from the NOR circuit 111 does not change because the input signal IN is already on the high level H.

When the input terminal IN attains the low level, the output signal from the NAND circuit 114 attains the high level, and the output signal from the inverter 115 attains the low level. In this regard, the gate capacitance of the NMOS transistor M102 is discharged, and therefore it takes a certain time until the gate voltage NL attains a low level. When the gate voltage NL of the NMOS transistor M102 decreases and reaches the half voltage Vdd/2, the output signal from a buffer circuit 116 inverts and attains a low level. In this regard, the capacitor C102 is discharged, and therefore it takes a certain time until the output signal B attains the low level as illustrated in FIG. 2.

When the gate voltage NL of the NMOS transistor M102 decreases and reaches the threshold voltage Vtn, the NMOS transistor M102 achieves the OFF state. At this time, the voltage of the input signal B has not yet decreased to the half voltage Vdd/2 and the gate voltage PH of the PMOS transistor M101 is still on the high level. Therefore, the PMOS transistor M101 maintains the OFF state. Thus, production of a through current can be prevented even when the input terminal IN changes to the low level L.

Further, when the voltage of the input signal B decreases and reaches the half voltage Vdd/2, the NOR circuit 111 attains the high level and the output signal from the inverter 112 attains the low level. In this regard, the gate capacitance of the PMOS transistor M101 is discharged, the gate voltage PH gradually decreases as illustrated in FIG. 2. When the gate voltage PH decreases and reaches the threshold voltage Vtn, the PMOS transistor M101 achieves the ON state. When the gate voltage PH further decreases and reaches the half voltage Vdd/2, the output signal from a buffer circuit 113 attains a high level. In this regard, the capacitor C101 is charged, and therefore it takes a certain time until the output signal A attains the low level as illustrated in FIG. 2. When the output signal from the buffer circuit 113 attains the low level, the input signal A to the NAND circuit 114 attains a low level but the output signal from the NAND circuit 114 is not changed because the input terminal IN is already on the low level.

Thus, it is impossible for the circuit illustrated in FIG. 1 that both the PMOS transistor and the NMOS transistor are on the ON state at the same time when the level of the signal input to the input terminal IN changes. Therefore, production of a through current can be prevented. However, occurrence of the problem in that both the PMOS transistor and the NMOS transistor are on the ON state at the same time is prevented by using a delay circuit utilizing the output current of the buffer circuit 113 and charging and discharging of the capacitor C101, and utilizing the output current of a buffer circuit 116 and charging and discharging of the capacitor C102. Therefore, it is necessary to set the delay time of the delay circuit to be longer than the times in which the PMOS transistor M101 and the NMOS transistor M102 are on the ON state. Therefore, the output circuit cannot perform high speed processing. In order to shorten the delay time, the precision of the delay time has to be enhanced. Specifically, since it is necessary for the output circuit to use a regulator circuit for trimming, etc., the area of the chip increases, resulting in increase of manufacturing costs of the output circuit because additional manufacturing processes are necessary.

In attempting to remedy the drawbacks, published unexamined Japanese patent application No. 2000-49586 discloses an output circuit without a delay circuit, which is illustrated in FIG. 3.

In the output circuit illustrated in FIG. 3, reference voltages Vthp and Vthn are set to be not greater than the threshold voltage of the PMOS transistor M101 and the threshold voltage of the NMOS transistor M102, respectively. The gate voltage PH of the PMOS transistor M101 is compared with the reference voltage Vthp by a comparator 124. When the gate voltage PH reaches the voltage at which the PMOS transistor M101 achieves an OFF state, the comparator 124 outputs a high level signal to open the gate of an AND circuit 125. In addition, the gate voltage NL of the NMOS transistor M102 is compared with the reference voltage Vthn by a comparator 126. When the gate voltage NL reaches the voltage at which the NMOS transistor M102 achieves an OFF state, the comparator 126 outputs a high level signal to open the gate of a NAND circuit 123. Thus, occurrence of the problem in that both the PMOS transistor and the NMOS transistor are on the ON state at the same time can be prevented, resulting in prevention of production of a through current.

However, the output circuit illustrated in FIG. 3 has a drawback in that since two reference voltages are set and two comparators are used, the size of the circuit increases, resulting in increase of the size of the chip, thereby increasing the manufacturing costs of the circuit.

Because of these reasons, a need exists for an output circuit, which can perform high speed processing without increasing the chip size.

SUMMARY OF THE INVENTION

As an aspect of the present invention, an output circuit for generating a binary output signal on the basis of an output signal is provided, which includes:

an input terminal configured to receive the input signal;

an output terminal configured to output the binary output signal;

a PMOS transistor connected with a positive side of a power supply voltage and the output terminal;

a NMOS transistor connected with a negative side of the power supply voltage and the output terminal;

a first inverter, to which a gate voltage of the PMOS transistor is input and which exhibits hysteresis in threshold voltage; and a second inverter, to which a gate voltage of the NMOS transistor is input and which exhibits hysteresis in threshold voltage, wherein an OR logic signal of the input signal and a signal obtained by inverting an output signal from the second inverter is input to a gate of the PMOS transistor, and an AND logic signal of the input signal and a signal obtained by inverting an output signal from the first inverter is input to a gate of the NMOS transistor.

These and other objects, features and advantages of the present invention will become apparent upon consideration of the following description of the preferred embodiments of the present invention taken in conjunction with the accompanying drawings.

DESCRIPTION OF THE PREFERRED EMBODIMENTS

The output circuit of the present invention will be explained by reference to drawings.

Figure 4:
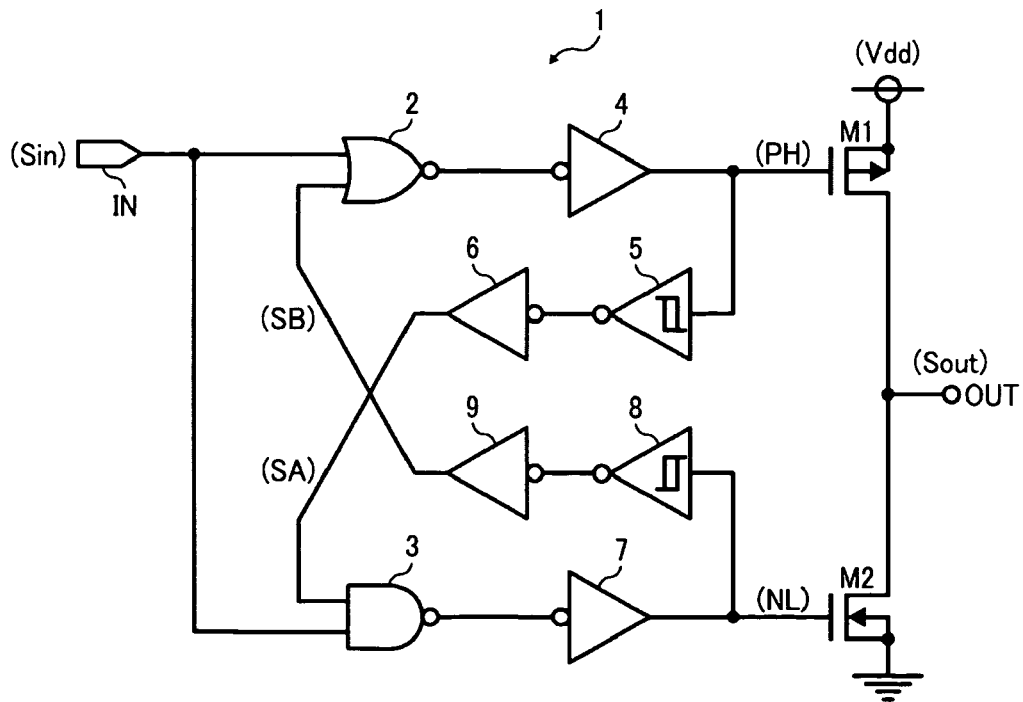
FIG. 4 is a schematic diagram illustrating an output circuit of an embodiment of the present invention.

FIG. 4 is a schematic diagram illustrating an example of the output circuit of the present invention.

Referring to FIG. 4, an output circuit 1 produces a binary signal Sout on the basis of an input signal Sin input to an input terminal IN and outputs the binary signal Sout from an output terminal OUT.

As illustrated in FIG. 4, the output circuit 1 includes a PMOS transistor M1, a NMOS transistor M2, a NOR circuit 2, a NAND circuit 3, and inverters 4-9. For example, when the output circuit 1 is used for synchronous rectification step-down switching regulators, the PMOS transistor M1 serves as a switching transistor, and the NMOS transistor M2 serves as a synchronous rectification transistor. The output terminal OUT is connected with a terminal of an inductor. In this regard, the inverter 5 serves as the first inverter, and the inverter 8 serves as the second inverter.

The input signal Sin is input to a first input terminal of each of the NOR circuit 2 and the NAND circuit 3. An output terminal of the NOR circuit 2 is connected with a gate of the PMOS transistor M1 via the inverter 4. In addition, an output terminal of the inverter 4 is connected with a second input terminal of the NAND circuit 3 via series circuits of the inverters 5 and 6. An output terminal of the NAND circuit 3 is connected with a gate of the NMOS transistor M2 via the inverter 7. Further, an output terminal of the inverter 7 is connected with a second input terminal of the NOR circuit 2 via series circuits of the inverters 8 and 9. The PMOS transistor M1 and the NMOS transistor M2 are serially connected between a power supply voltage Vdd and a ground voltage GND. In addition, the junction of the PMOS transistor M1 and the NMOS transistor M2 serves as the output terminal OUT.

In the output circuit having such a configuration, the inverters 5 and 8 exhibit hysteresis in threshold voltage.

Figure 5:
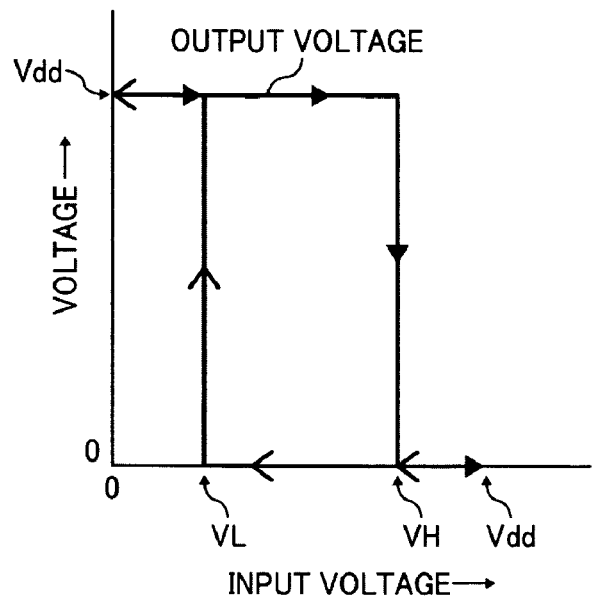
FIG. 5 is a schematic view for explaining hysteresis of threshold voltages of inverters used for the output circuit illustrated in FIG. 4.

FIG. 5 is a schematic view for explaining hysteresis of threshold voltages of the inverters 5 and 8. Namely, FIG. 5 illustrates the relationship between the input voltage and the output voltage in the inverters 5 and 8. Specifically, when the input voltage increases, the output voltage changes along a line indicated by a narrow with a black solid head. In contrast, when the input voltage decreases, the output voltage changes along a line indicated by a normal arrow.

The hysteresis in threshold voltage will be explained in detail by reference to FIG. 5. When the input voltage is 0 v, the output voltage is on a high level, i.e., the output voltage is Vdd. When the input voltage increases and reaches a voltage VH, the output voltage attains a low level (i.e., 0 v). In addition, even when the input voltage further increases from VH to Vdd, the output voltage remains at 0 v. In contrast, when the input voltage decreases from the power supply voltage Vdd toward a voltage VL lower than the voltage VH, the output voltage remains at the low level (i.e., 0 v). However, when the input voltage reaches the voltage VL, the output voltage returns to the high level (i.e., Vdd). Even when the input voltage decreases from the voltage VL to 0 v, the output voltage remains at the high level (i.e., Vdd). The voltage VH (hereinafter sometimes referred to as the higher level threshold voltage) is set so as to be almost equal to the threshold voltage of the PMOS transistor M1, and the voltage VL (hereinafter sometimes referred to as the lower level threshold voltage) is set so as to be almost equal to the threshold voltage of the NMOS transistor M2.

Figure 6:
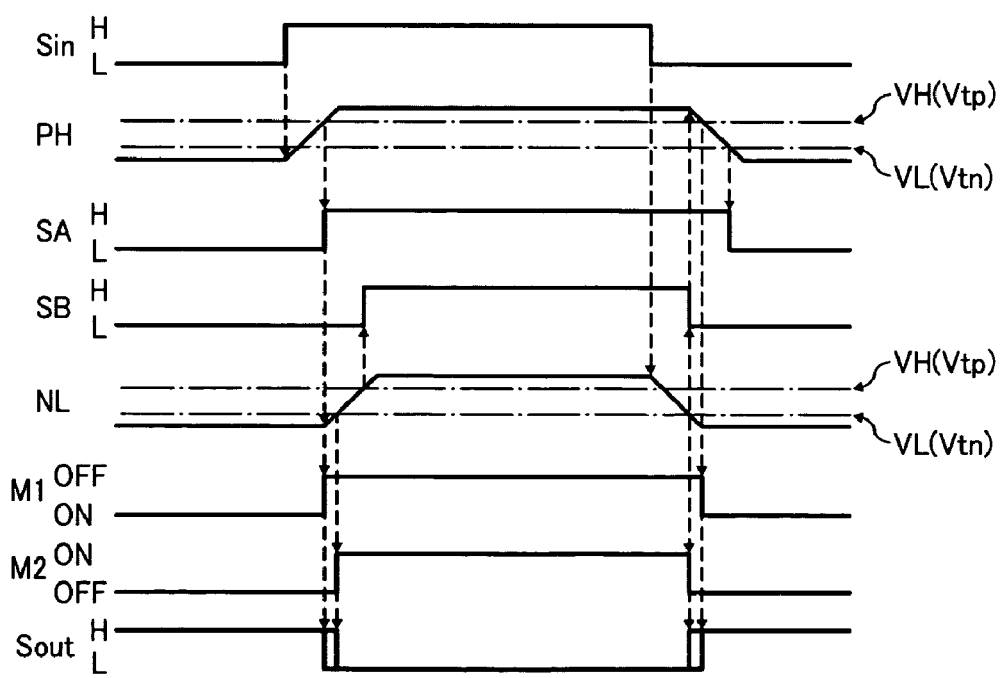
FIG. 6 is a timing chart illustrating waveforms at several portions of the output circuit illustrated in FIG. 4.

FIG. 6 is a timing chart illustrating the waveforms at several portions of the output circuit illustrated in FIG. 4. In FIG. 6, a character PH denotes the gate voltage of the PMOS transistor M1; a character SA denotes an input signal input to the second input terminal of the NAND circuit 3; a character SB denotes an input signal input to the second input terminal of the NOR circuit 2; a character NL denotes the gate voltage of the NMOS transistor M2; a character M1 denotes an ON or OFF state of the PMOS transistor M1; and a character M2 denotes an ON or OFF state of the NMOS transistor M2.

Next, the operation of the output circuit 1 illustrated in FIG. 4 will be explained by reference to FIG. 6.

When the input signal Sin is on a low level, the output signal from the NAND circuit 3 is on a high level. Therefore, the output signal from the inverter 7 is on a low level, and the gate voltage NL is on a low level. Accordingly, the NMOS transistor M2 achieves an OFF state.

In addition, since the gate voltage NL of the NMOS transistor M2 is on the low level, the input signal SB input to the second input terminal of the NOR circuit 2 is on a low level, and the output signal from the NOR circuit 2 is on a high level. Further, since the output signal from the inverter 4 is on a low level, the gate voltage PH is also on a low level and the PMOS transistor M1 achieves an ON state. Furthermore, since the gate voltage PH of the PMOS transistor M1 is input to the second input terminal of the NAND circuit 3 via the inverters 5 and 6, the input signal SA to the second input terminal of the NAND circuit 3 is on a low level.

When the input signal Sin attains a high level, the output signal from the NOR circuit 2 attains a low level and the output signal from the inverter 4 attains a high level. In this regard, the gate capacitance of the PMOS transistor M1 is charged, and therefore it takes a certain time until the gate voltage PH reaches a high level as illustrated in FIG. 6. When the gate voltage PH of the PMOS transistor M1 reaches the higher level threshold voltage VH, the level of the output signal from the inverter 5 is inverted and the inverted output signal is input as a high level input signal SA to the second input terminal of the NAND circuit 3 via the inverter 6.

In this regard, since the higher level threshold voltage VH is set to be almost equal to the threshold voltage Vtp of the PMOS transistor M1, the input signal SA input to the second input terminal of the NAND circuit 3 attains a high level. Therefore, when the gate of the NAND circuit is opened, the PMOS transistor M1 is in the OFF state. Since the gate voltage NL of the NMOS transistor M2 does not change at this time, the NMOS transistor M2 remains in the OFF state. Therefore, when the input signal Sin is changed from the low level to the high level, production of a through current can be prevented.

When the input signal SA input to the second input terminal of the NAND circuit 3 attains the high level, the output signal from the NAND circuit 3 attains a low level and the output signal from the inverter 7 attains a high level because the input signal Sin input to the first terminal of the NAND circuit 3 is already on the high level. In this regard, since the gate capacitance of the NMOS transistor M2 is charged, the gate voltage NL gradually increases as illustrated in FIG. 6. When the gate voltage NL reaches the threshold voltage Vtn of the NMOS transistor M2, the NMOS transistor M2 achieves an ON state. Since the PMOS transistor M1 has already achieved an OFF state at this time, a through current is not flown. When the gate voltage NL further increases and reaches the high voltage VH, the level of the output signal from the inverter 8 is inverted, thereby allowing the input signal SB to the second input terminal of the NOR circuit 2 to attain a high level. However, since the input signal Sin is already on the high level, the gate voltage PH of the PMOS transistor M1 does not change.

When the input signal Sin attains a low level, the output signal from the NAND circuit 3 attains the high level and the output signal from the inverter 7 is inverted to attain the low level. In this regard, the gate capacitance of the NMOS transistor M2 is discharged, and therefore it takes a certain time until the gate voltage NL reaches the low level as illustrated in FIG. 6. When the gate voltage NL of the NMOS transistor M2 decreases to the lower level threshold voltage VL, the output signal from the inverter 8 is inverted to attain a high level, thereby allowing the input signal SB to the second input terminal of the NOR circuit 2 to attain the low level.

In this regard, the lower level threshold voltage VL is set to be substantially equal to the threshold voltage Vtn of the NMOS transistor M2. Therefore, when the gate of the NOR circuit 2 is opened while the input signal SB to the NOR circuit 2 is on the low level, the NMOS transistor M2 is in the OFF state. Since the gate voltage PH of the PMOS transistor M1 has not yet changed at this time, the PMOS transistor M1 remains at the OFF state. Therefore, production of a through current can be prevented in the transition process of the input signal Sin of from the high level to the low level.

When the input signal SB input to the second input terminal of the NOR circuit 2 attains the low level, the output signal from the NOR circuit 2 attains the high level and the output signal from the inverter 4 attains the low level because the input signal Sin has already achieved the low level. In this regard, the gate capacitance of the PMOS transistor M1 is discharged, and therefore the gate voltage PH gradually decreases as illustrated in FIG. 6. When the gate voltage PH reaches the threshold voltage Vtp of the PMOS transistor M1, the PMOS transistor M1 achieves the ON state. Since the NMOS transistor M2 is already in the OFF state at this time, production of a through current can be prevented. When the gate voltage PH further decreases and reaches the lower level threshold voltage VL, the output signal from the inverter 5 is inverted to attain a high level, thereby allowing the input signal SA to the second input terminal of the NAND circuit 3 to attain the low level. In this regard, since the input signal Sin is already on the low level, the gate voltage NL of the NMOS transistor M2 does not change.

Figure 7:
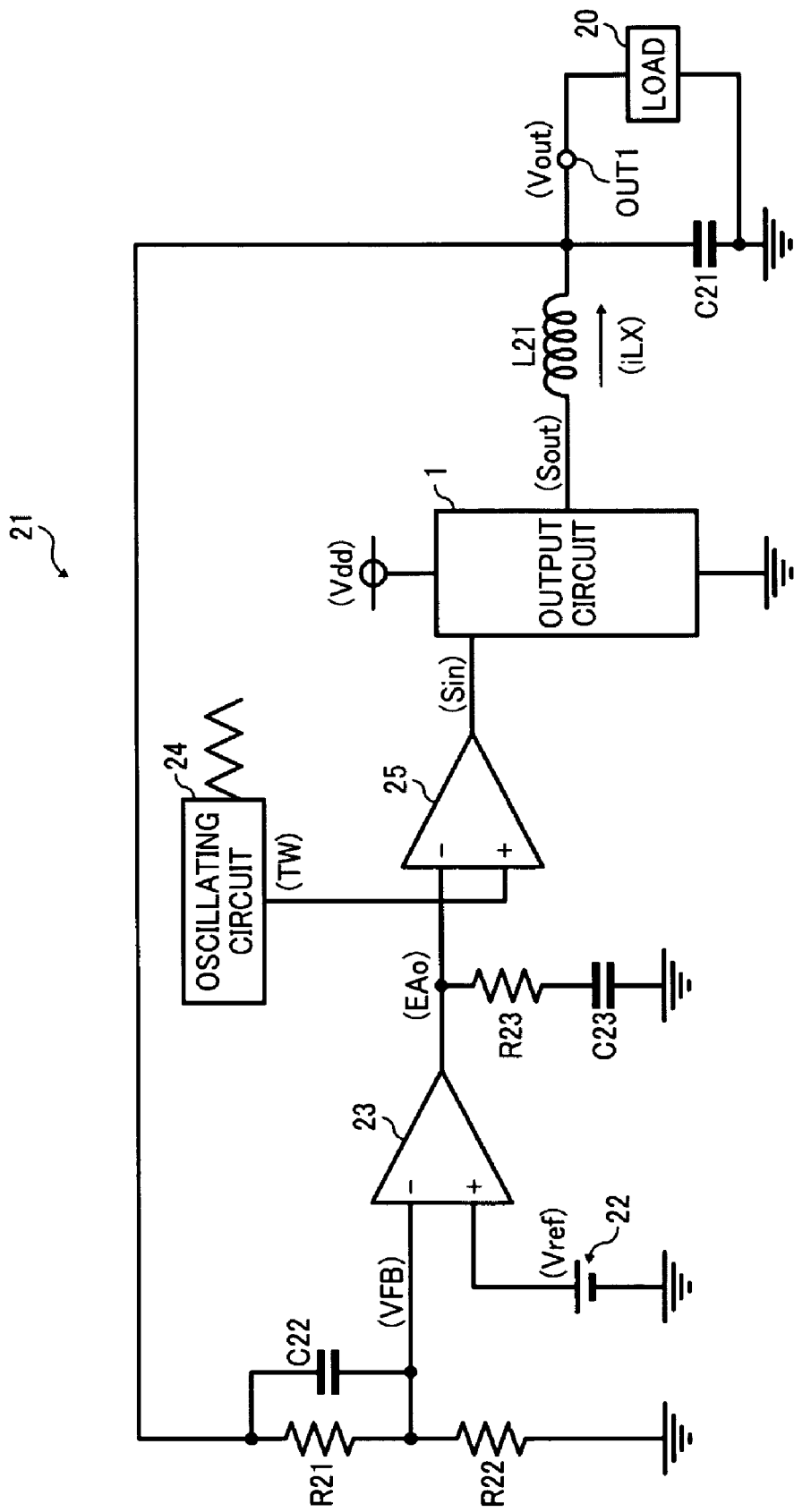
FIG. 7 is a schematic diagram illustrating a synchronous rectification step-down switching regulator for which the output circuit of the present invention is used.

FIG. 7 is a schematic view illustrating a synchronous rectification type step-down switching regulator, for which the output circuit 1 illustrated in FIG. 4 is used.

A switching regulator 21 illustrated in FIG. 7 converts a power supply voltage Vdd to a predetermined voltage, and outputs the voltage, as an output voltage Vout, to a load 20 from an output terminal OUT1 thereof.

The switching regulator 21 includes the output circuit 1; a reference voltage generating circuit 22; resistors R21 and R22 used for detecting the output voltage; an inductor L21; a smoothing capacitor C21; a resistor R23 and capacitors C22 and C23 for use in phase compensation; an error amplification circuit 23; an oscillating circuit 24; and a PWM comparator 25.

The reference voltage generating circuit 22 generates and outputs a predetermined reference voltage Vref. The resistors R21 and R22 for use in detecting the output voltage divide the output voltage Vout to generate and output a divided voltage VFB. The error amplification circuit 23 amplifies the difference in potential between the divided voltage VFB and the reference voltage Vref to generate and output an output signal EAo.

The oscillating circuit 24 generates and outputs a predetermined triangular waveform signal TW. The PWM comparator 25 generates a pulse signal Sin for performing PWM controlling using the output signal EAo output from the error amplification circuit 23 and the triangular waveform signal TW, and outputs the pulse signal Sin to the output circuit 1.

The inductor L21 is connected with an output terminal of the output circuit 1 and the output terminal OUT1, and the resistors R21 and R22 are serially connected with the output terminal OUT1 and a ground GND while the capacitor C21 is connected therebetween. Therefore, the divided voltage VFB is output from the connection point between the resistors R21 and R22. In addition, the capacitor C22 for phase compensation is connected in parallel with the resistor R21. In the error amplification circuit 23, the divided voltage VFB is input to an inverting input terminal and the reference voltage Vref is input to a non-inverting input terminal. The output terminal of the error amplification circuit 23 is connected with an inverting input terminal of the PWM comparator 25.

A series circuit constituted of the resistor R23 and capacitor C23 is connected with the output terminal of the error amplification circuit 23 and the ground GND, and therefore the series circuit serves as a phase compensating circuit. The triangular wave-form signal TW is input to a non-inverting input terminal of the PWM comparator 25, and the pulse signal Sin output from the PWM comparator 25 is input to the output circuit 1.

When the output voltage Vout from the switching regulator 21 having such configuration increases, the voltage of the output signal EAo from the error amplification circuit 23 decreases, and thereby the duty cycle of the output signal Sin from the PWM comparator 25 is decreased. As a result, the time during which the output signal Sout from the output circuit 1 is on the high level is shortened, and the time during which the output signal Sout from the output circuit 1 is on the low level is prolonged. Thus, controlling such that the output voltage Vout from the switching regulator 21 is decreased is performed.

In contrast, when the output voltage Vout from the switching regulator 21 having such configuration decreases, the voltage of the output signal EAo from the error amplification circuit 23 increases, and thereby the duty cycle of the output signal Sin from the PWM comparator 25 is increased. As a result, the time during which the output signal Sout from the output circuit 1 is on the high level is prolonged, and the time during which the output signal Sout from the output circuit 1 is on the low level is shortened. Thus, controlling such that the output voltage Vout from the switching regulator 21 is increased is performed. By repeating such operations, the output voltage Vout is controlled to be a predetermined voltage.

As mentioned above, the output circuit of the present invention does not cause the through current problem in that both the PMOS transistor M1 and NMOS transistor M2 achieve an ON state at the same time in the transition process of the input signal Sin of from the high level to the low level or vice versa, and thereby a through current is produced. In addition, since the output circuit of the present invention does not use a delay circuit unlike conventional output circuits, the output circuit has advantages such that it is unnecessary to adjust the delay time of the delay circuit and high speed processing can be performed.

Figure 1:
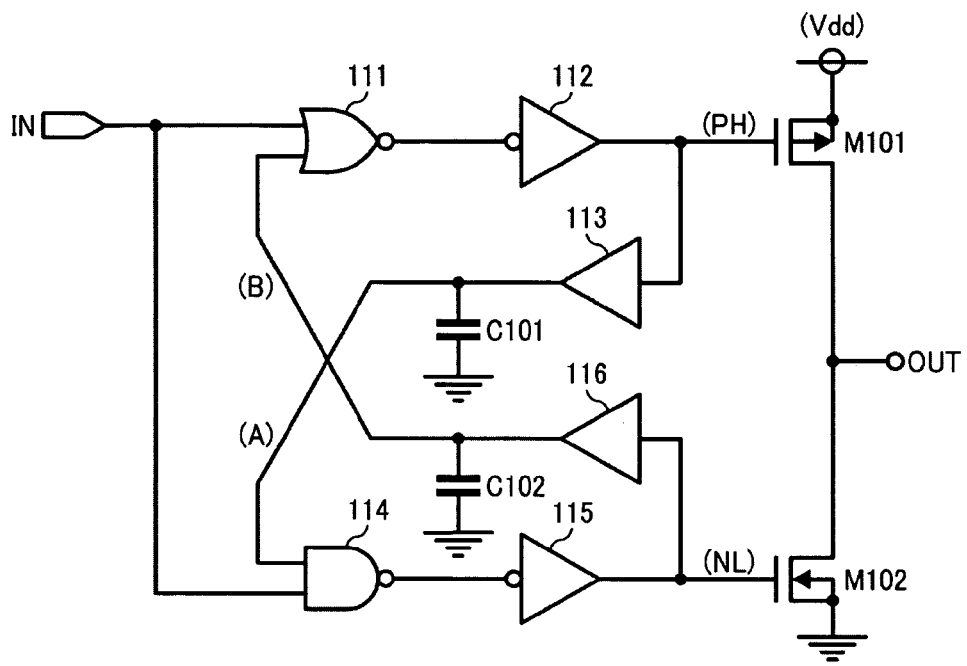
FIG. 1 is a schematic diagram illustrating a background output circuit.
Figure 2:
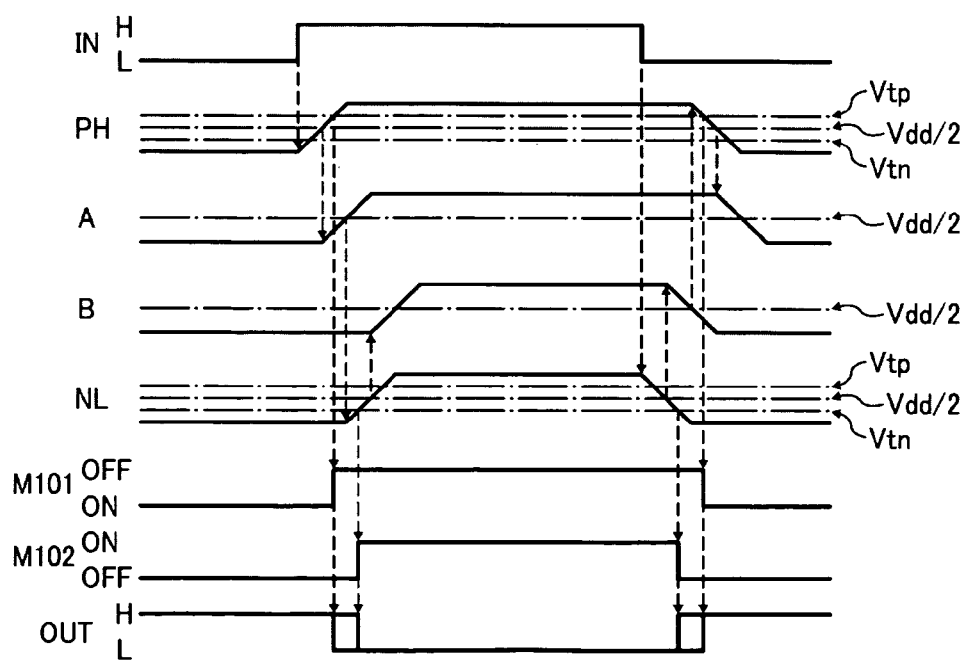
FIG. 2 is a timing chart illustrating waveforms at several portions of the background output circuit illustrated in FIG. 1.
Figure 3:
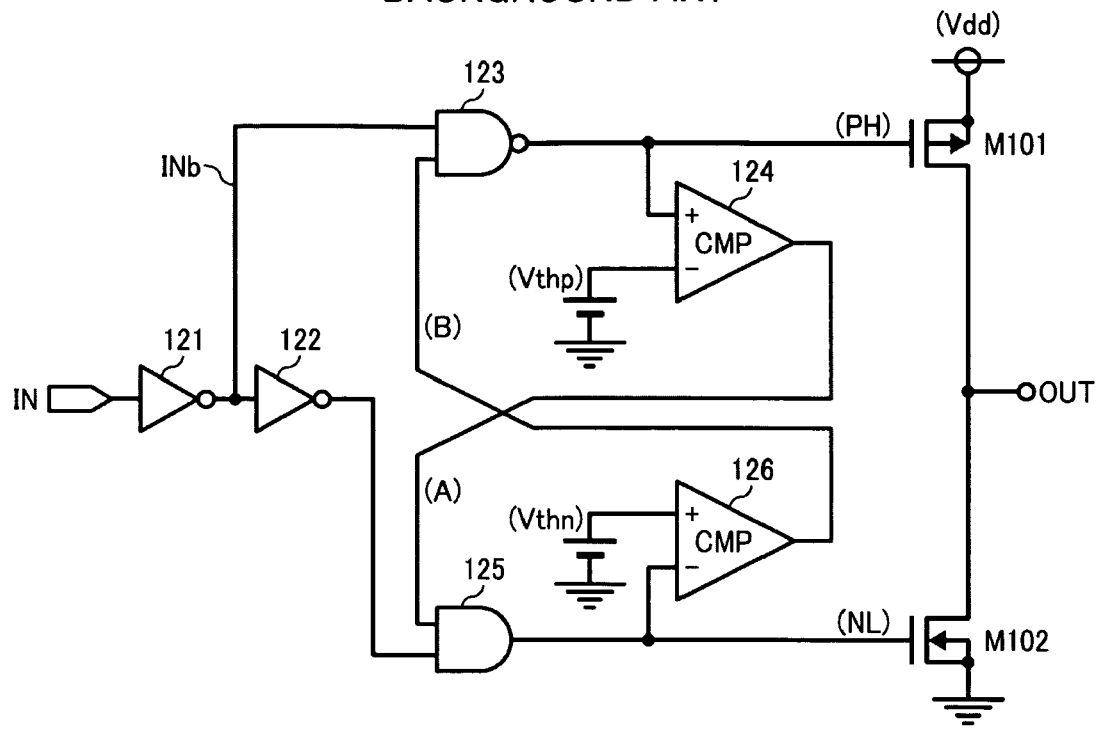
FIG. 3 is a schematic diagram illustrating another background output circuit.

Further, the output circuit of the present invention uses an inverter exhibiting hysteresis instead of the reference voltages and comparators used for the conventional output circuit illustrated in FIG. 3. Therefore, the output circuit can prevent occurrence of the through current problem, although the output circuit is a simple circuit.

Furthermore, the higher level threshold voltage of each of the inverters 5 and 8 is set to be substantially equal to the threshold voltage of the PMOS transistor M1 and the lower level threshold voltage of the threshold voltage of each of the inverters 5 and 8 is set to be substantially equal to the threshold voltage of the NMOS transistor M2. Therefore, occurrence of the through current problem can be securely prevented.

Additional modifications and variations of the present invention are possible in light of the above teachings. It is therefore to be understood that within the scope of the appended claims the invention may be practiced other than as specifically described herein.

This document claims priority and contains subject matter related to Japanese Patent Application No. 2007-238274, filed on Sep. 13, 2007, the entire contents of which are herein incorporated by reference.

What is claimed is:

1. An output circuit for generating a binary output signal on the basis of an input signal, comprising:
   an input terminal configured to receive the input signal;
   an output terminal configured to output the output signal;
   a PMOS transistor connected with a positive side of a power supply voltage and the output terminal;
   a NMOS transistor connected with a negative side of the power supply voltage and the output terminal;
   a first inverter, to which a gate voltage of the PMOS transistor is input and which exhibits hysteresis in threshold voltage; and
   a second inverter, to which a gate voltage of the NMOS transistor is input and which exhibits hysteresis in threshold voltage, wherein an OR logic signal of the input signal and a signal obtained by inverting an output signal from the second inverter is input to a gate of the PMOS transistor, and an AND logic signal of the input signal and a signal obtained by inverting an output signal from the first inverter is input to a gate of the NMOS transistor.

2. The output circuit according to claim 1, wherein a higher level threshold voltage of the threshold voltage of each of the first and second inverters is substantially equal to a threshold voltage of the PMOS transistor and a lower level threshold voltage of the threshold voltage of each of the first and second inverters is substantially equal to a threshold voltage of the NMOS transistor.

3. The output circuit according to claim 2, wherein the hysteresis in threshold voltage of the first and second inverters is that the first and second inverters have the higher level threshold voltages when the output signal is changed from a high level to a low level, and the first and second inverters have the lower level threshold voltages when the output signal is changed from a low level to a high level.

* * * * *